United States Patent [19]
Curtin

[11] Patent Number: 5,820,983
[45] Date of Patent: Oct. 13, 1998

[54] ASSEMBLY KIT FOR A NESTED SUPPORT FIXTUE FOR PC CARDS

[75] Inventor: Mark Curtin, Boston, Mass.

[73] Assignee: Transition Automation, Inc., N. Billerica, Mass.

[21] Appl. No.: 824,812

[22] Filed: Mar. 26, 1997

Related U.S. Application Data

[60] Division of Ser. No. 494,706, Jun. 26, 1995, which is a continuation-in-part of Ser. No. 393,092, Feb. 22, 1995, abandoned.

[51] Int. Cl.⁶ .......................... B29C 33/00; B29C 43/56
[52] U.S. Cl. ................. 425/388; 425/389; 425/DIG. 60; 425/DIG. 119; 249/113
[58] Field of Search ..................... 425/380, 85, DIG. 60, 425/DIG. 119, 389; 249/112, 113; 264/225

[56] References Cited

U.S. PATENT DOCUMENTS

| | | |
|---|---|---|
| 4,778,641 | 10/1988 | Chia . |
| 4,810,616 | 3/1989 | Grabbe et al. . |
| 4,818,724 | 4/1989 | Cetronio et al. . |
| 4,961,893 | 10/1990 | Rose . |
| 5,037,599 | 8/1991 | Olson ..................................... 425/389 |
| 5,045,914 | 9/1991 | Casto et al. . |
| 5,054,193 | 10/1991 | Ohms et al. . |
| 5,091,769 | 2/1992 | Eichelberger . |
| 5,106,784 | 4/1992 | Bednarz . |
| 5,123,985 | 6/1992 | Evans et al. ............................ 425/389 |
| 5,164,335 | 11/1992 | Sato et al. . |
| 5,216,278 | 6/1993 | Lin et al. . |
| 5,218,759 | 6/1993 | Juskey et al. . |
| 5,303,820 | 4/1994 | Comtois . |
| 5,303,824 | 4/1994 | Kohn . |
| 5,320,226 | 6/1994 | Merrill . |
| 5,353,498 | 10/1994 | Fillion et al. . |
| 5,354,714 | 10/1994 | Boysel . |
| 5,576,030 | 11/1996 | Hooper .................................... 425/389 |
| 5,578,158 | 11/1996 | Gutowski et al. ....................... 425/388 |

FOREIGN PATENT DOCUMENTS

| | | | |
|---|---|---|---|
| 2172542 | 9/1986 | United Kingdom ................... | 425/389 |

OTHER PUBLICATIONS

IBM Technical Disclosure Bulletin, Coated Wafter Carriers, vol. 27, No. 10A, Mar. 1995.
IBM Technical Disclosure Bulletin, Card Holder and Lock, vol. 29, No. 1, Jun. 1986.
IBM Technical Disclosure Bulletin, Mask Assembly and Wafer Tray, vol. 29, No. 2, Jul. 1986.
IBM Technical Disclosure Bulletin, Mult–Purpose Tote and Insertion System for Generic Material Handling, vol. 31, No. 6, Nov. 1988.
IBM Technical Disclosure Bulletin, Standoff Attach Tool, vol. 32, No. 4A, Sep. 1989.
IBM Technical Disclosure Bulletin, Multiple Substrate Package, vol. 35, No. 4A, Sep. 1992.

*Primary Examiner*—Khanh P. Nguyen
*Attorney, Agent, or Firm*—Samuels, Gauthier, Stevens & Reppert

[57] ABSTRACT

A kit for a support fixture for a PC card. THe kid comprises a membrane and a PC card, a compliant-porous member, a vacuum platen, a rectangular frame, and a cylindrical plug which are placed under the membrane. The frame is used to create a mold to pour a casting material into and the cylindrical plug is used to create a recess to allow easy finger access to remove the PC card from the fixture.

1 Claim, 10 Drawing Sheets

ASSEMBLY KIT FOR A NESTED SUPPORT FIXTUE FOR PC CARDS

REFERENCE TO RELATED APPLICATION

This application is a divisional of U.S. application Ser. No. 08/494,706 filed Jun. 26, 1995, which is a continuation-in-part application of U.S. application Ser. No. 08/393,092 filed on Feb. 22, 1995 now abandoned.

FIELD OF THE INVENTION

The invention relates to a fixture to support a card used in surface mount technology (SMT). The fixture supports one side of the card while components are positioned and attached to the other side.

BACKGROUND AND SUMMARY OF THE INVENTION

During the assembly of a circuit, a card is fed into different machines. The first machine is a solder paste printer which prints the solder paste pattern and the second machine is a component pick and place machine which positions and fixes the components into the solder paste. During the conveyor transport and processing of the card, it experiences forces, which distort the surface of the card. For example, the card is typically fed into the machines on "rail" conveyors. These conveyors have belts which touch the outside edges of the card. Because the board spans from one rail to the other, many times the weight of the card alone will cause it to flex. The assembly processes (namely printing and component placement) require a flat, rigid circuit surface—any flexing and distortion causes quality problems and defects. The costs of repairing or reprocessing are very high. These production lines generally run as fast as possible, so it is very costly to implement custom tooling to support the boards.

Most assembly machines are designed for thick, rigid boards with components on one side. Electronic miniaturization for notebook computers and portable devices has forced manufacturers to reduce the thickness of the boards. The board sizes have shrunk as well. When the board size is reduced, manufacturers will process several cards as one "panel". In panel form, the card rigidity is reduced further because the fabrication process adds "routed" slots which allow the manufacturer to "break" the finished cards out of the panel after assembly.

The thinner cards and the routed slots of the panels have reduced the rigidity to a point where the cards are extremely flexible and the quality of the finished card is severely affected.

In the surface mount printing process, cards move under a stencil foil (which has a matching pattern) and solder paste is deposited onto the card. In the printing process there is a squeegee which must press onto the thin stencil foil mask. The force can exceed one pound per inch of squeegee. The printing process requires that the squeegee force be transmitted to the circuit card. The goal is for the squeegee to push the stencil against the card, and then to slide solder paste across the top of the stencil to complete the printing process. Sufficient pressure is required to insure a good gasket between the stencil and card, and to prevent solder paste from extruding under the squeegee.

To achieve good quality with the printing process just described, the card must be supported.

There are two types of printing machines in use today: Batch machines with a tooling plate that shuttles the card in and out of the printing area, and Automatic In-Line machines which feed the card on rail conveyors into the print area, where an elevating tooling plate rises to make contact with the card.

Figure 1:
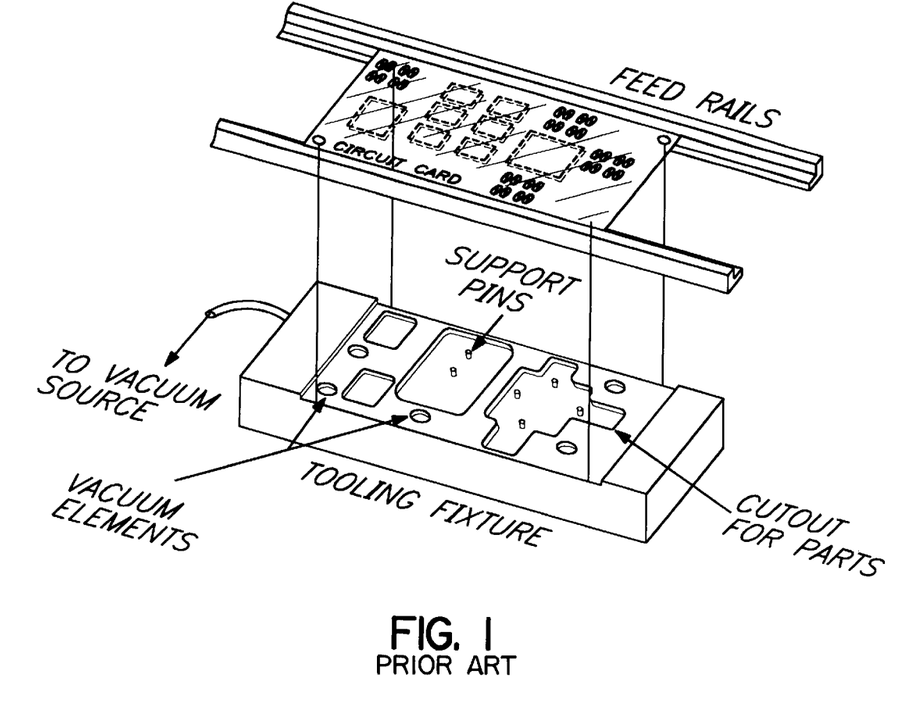
FIG. 1 is a perspective view of a prior art, custom tooling plate for an in-line printing system.

For purposes of this disclosure, the processing of the top side and bottom side of the card are referred to as "side 1" and "side 2" respectively. The side 2 assembly process is different from the side 1 assembly process because the circuit card must be handled with components already assembled to side 1. In this mode, neither the batch machines nor the in-line machines can support the circuit card without the use of customized tooling. Because the board is not flat on the bottom, a tooling plate must be machined out of solid aluminum (for stiffness). This requires complicated cut out patterns to avoid contact and damage to the components on the underside of the circuit card. These plates add engineering time and cost to the production of the thin circuit cards. (For side 1 production, the circuit card is essentially flat on the bottom. Therefore, simply placing the card on a flat piece of aluminum is sufficient for processing). FIG. 1 shows a prior art custom tooling plate for an in-line printing system.

It should be noted that when processing the circuit card, a tooling plate provides three functions: 1) it supports the assembly and provides "nesting" for underside components, 2) it registers the location of the circuit card using tooling pins, and 3) it provides some form of hold-down technique, such as vacuum or edge clips. This hold-down is necessary for boards that have warpage, and do not lay flat in the tooling plate nest.

Figure 2:
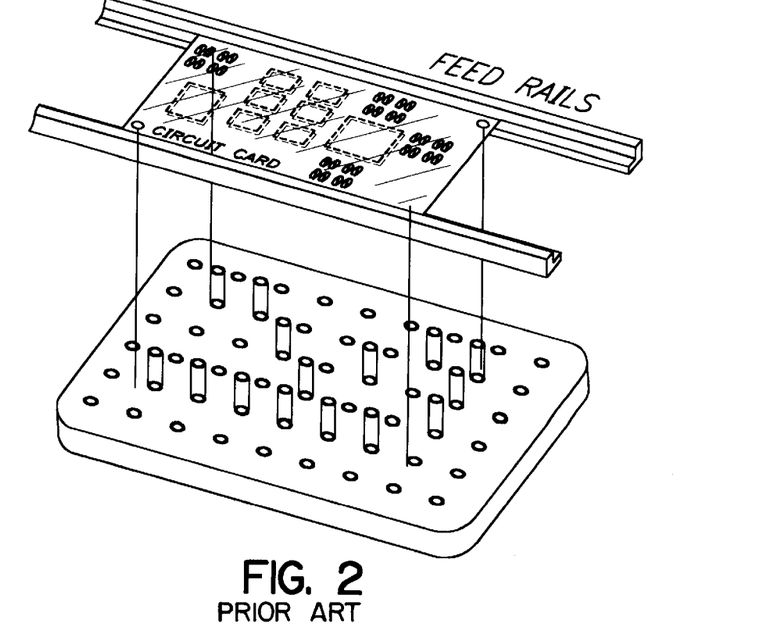
FIG. 2 is a perspective view of a prior art fixture using support pins.

An alternative prior art tooling method using support pins, see FIG. 2, is sometimes employed with in-line automatic printers and placement equipment. This method feeds the card into the print area. Once positioned, an array of support pins is brought into contact with the circuit card's bottom side. This method is more common, but less effective than the machined plate method. It has a lower cost because the pins may be repositioned for use on other cards (rather than having to machine a new tooling nest). However, for cards less than 0.059" thick the pins are not spaced closely enough to prevent flexing. It would be difficult to modify this technology to handle the thin cards. Finally, this method involves lengthy setup times, each pin must be checked for x-y location, and must be positioned in the z-axis to accommodate the height of any components the pin is touching.

In summary, both the custom tooling plate and the pin-array method involve lengthy setup times. Although the custom machined plate is effective, the cost is very high ($500–$1500 each plate), and the plates are not reusable. The pin-array method does not work with thin cards. The flexing reduces the print quality to unacceptable levels.

The problems caused by the flexing of the cards, although described in reference to the printing step, are also common to the step of component alignment and placement.

In summary with these prior art techniques the steps involved making a typical side 2 custom tooling nest are first, the component locations and board outline for side 1 are plotted out on a drawing with dimensions. Then an engineer carefully designs cutout regions based on the side 1 component information. This engineering effort involves deciding what radius tool to be used for the component cutouts, and selecting the clearances around parts. Further, the engineer must locate tooling pins, and hold down elements so the circuit card is registered accurately, and it is pulled down flat. This design process can take as long as 3 days. The ability to produce a perfect tooling plate the first time is limited. This fixture is designed with respect to the engineering drawings for the PC card and the components. However, components for side 1 may actually have a variation in size and shape. These variations cause interference and sometimes a second fixture has to be designed. This design time extends the setup of the manufacturing process beyond what is reasonable. After the design is complete, the engineering information is passed to a machine shop which mills the aluminum plate to specifications. This step adds additional time.

Figure 3:
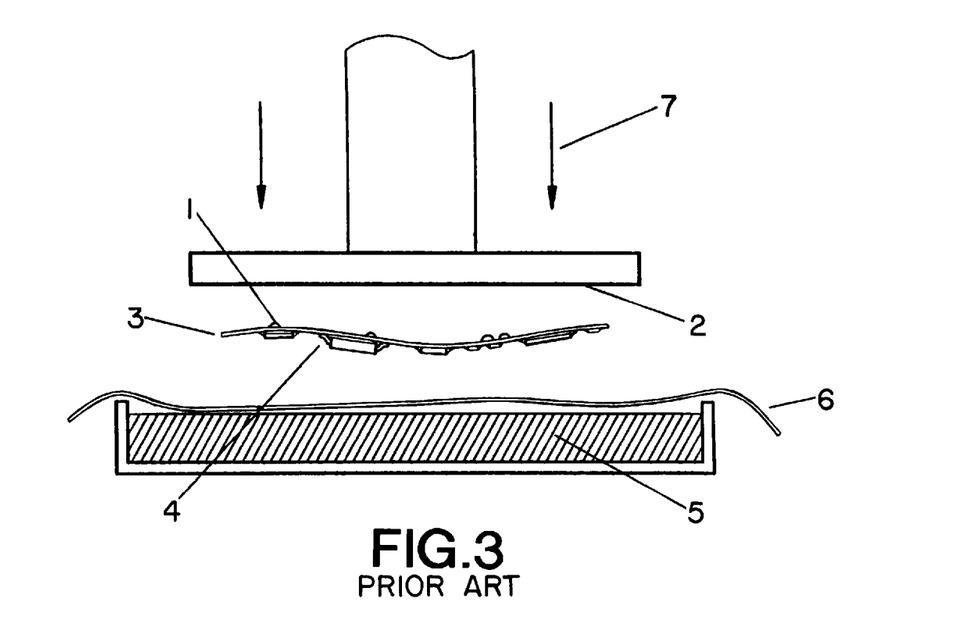
FIG. 3 is an illustration of a prior art fixture using compliant foam.

A third alternative prior art 'tooling' method, FIG. 3, utilizing a moldable foam material (or viscous curable liquid) is disclosed in U.S. Pat. No. 5,054,193. This method teaches creating a recessed tooling plate by heating a heat-moldable foam, pressing the side 1 of the card into the foam and then cooling the foam to retain the shape of the PC card side 1. An alternative embodiment suggests a curable viscous material and a membrane to separate the material from the PC card.

There are several problems associated with the disclosed process and fixture. There is no teaching of how to handle and support the PC card during testing. A nest formed with a molding process is inadequate without an effective PC card support and preparation stage. This PC card support is inadequate because the non-component side of the PC card is not perfectly smooth. There are inherently small bumps such as the printed wiring, printed wiring bumps, plating bumps or other surface profile features which make the non-component side non-flat. If a flat plate is used to press the card into the foam, then the card will flex on the points of contact with the plate, producing a non-flat support fixture. This flexure is a deviation from true flatness. The bumps will be randomly located from one card to another so this fixture forming process is sensitive to these bumps. The fixture will have a planar error which would affect overall support.

The bumps on the non-component side 1 occupy a very small percentage of area (under 5%) while the components on side 2 occupy more than 60% of the area.

As described hereinafter, this bump and flexing problem does not occur with the invention disclosed herein because a thin compliant layer is placed between the PC card and the support plate. Since the bumps occupy only a small percentage of area, they depress into the compliant member until the PC card surface touches. Thus, this brings the PC card parallel with the support plate.

A second drawback with the '193 patent is the use of the foam as a "spring" to press the PC card back to the support plate. The pressure created by the compliant foam will be proportional to the displacement of the foam. Therefore, the back pressure will be uneven.

The invention described herein in one aspect comprises the use of a viscous casting material with a very distinct PC card preparation sequence to form a nested support fixture. Another aspect of the invention is an improved molded (tooling plate) support fixture. The support fixture of this invention produces planar support even when the PC card has inherent warpage and side 2 bumps.

In one embodiment of the invention, the support fixture is formed by a combination of a vacuum platen, a compliant member on the platen which member supports a PC card, side 2, an impermeable stretchable membrane and a perimeter wall to define a well.

The PC card is drawn down flat into the compliant member which lies on the flat vacuum platen. This "drawing" action is achieved by use of vacuum and the impermeable, stretchable membrane.

The invention described in this disclosure places a compliant member between the flat surface onto which the PC card rests. This compliant member serves two unique functions. This complaint layer (to be described in detail later) allows the bumps to sink in, while the flat surface of the PC card rests flush with the compliant layer.

When the membrane is drawn fully down onto the PC card, it pulls and flattens the PC card and defines its position and planarity in preparation for casting. The bumps will have depressed into the compliant member. The membrane is actively utilized as a mechanical locking mechanism. A perimeter wall is formed and a very accurate three dimensional mold results.

Stated otherwise this invention comprises a flexible membrane which is used as a vacuum seal to pull the PC card flat and to press it into the thin compliant member. The complaint member allows bumps on the non-component side to depress in, leveling the PC card to a true flat plane. The compliant member distributes the vacuum over the full area of the complaint member. If this complaint member were non-porous, the vacuum would not distribute evenly, and the forces holding the card in place would be non-uniform. The compliant member maintains equal, distributed PC card support and pressure by use of a central vacuum and the membrane which sandwiches the PC card and compliant member.

The invention described is insensitive to sample PC card warpage, and side 2 bumps, both of which occur randomly.

The present invention combines the vacuum, the compliant-porous member which distributes the vacuum, and the membrane to force the membrane into a three-dimensional contour of the sample PC card without wrinkles. This is accomplished because the vacuum causes the forces to be distributed everywhere over the membrane area, pulling and eliminating wrinkles.

Simply placing a three-dimensional detailed object (PC card) into a viscous liquid or into a foam with a membrane separating them will involve many regions of entrapped air, or in the case of the foam, entrapped and displaced air. These air bubbles will become incorporated into the finished fixture and will result in a lack of support.

The present invention is further distinguished from the prior art in the ability to seal objects and create accurate three dimensional geometries of these objects from the surface of the component side of the PC card.

In a preferred embodiment of the invention, in forming a support fixture, a rectangular frame and a cylindrical plug are placed under the membrane. The frame is used to create a mold and the cylindrical plug is used to create a recess to allow easy finger access to remove the PC card from the fixture. By placing the plug and frame under the membrane, and drawing vacuum, the invention provides a "locking and fixing" capability for any geometric elements that are required in the finished support fixture. Alternatively, geometric elements may be anchored into the mold material, for permanent use, or for later removal, to create elements which are not separated from the mold by the membrane.

A casting material is poured into the mold (the region defined by the rectangular frame and PC card surface both of which are covered by the membrane). The membrane serves to hold the elements in place during the casting step and also serves to prevent contamination of the components on the PC board. The thickness of the membrane serves to enlarge the recesses in the finished fixture. The thickness is set to a minimum (0.01 inches). This thickness enlarges the recesses.,, while covering over small delicate areas which, if uncovered, would result in a fixture which may damage delicate areas.

Other elements such as tooling pins or vacuum plugs may be anchored into the casting material directly by positioning them before or after the casting material is poured. These elements may be placed outside the membrane or the membrane may be cut and the elements placed directly in contact with the PC card. A unique aspect of this system is the ability to excise the membrane to anchor elements so they are directly in contact with the PC card. When the membrane is fully evacuated, it may be excised on smooth areas. The excising does not break the vacuum because the open area remains sealed due to the flat contact between the membrane and the surface of the card.

The casting material is poured to overfill the mold. A backing plate is pressed onto the overfilled mold. The plate squeezes excess casting material out through large back holes and around the edges of the frame. The large holes in the back plate serve three functions. They provide a standard pattern within which vacuum feed holes are placed. This enables a single manifold vacuum block to accommodate many cast fixtures. They provide a locking feature to keep the hardened casting material attached to the back plate. Thus, they serve to "lock" the back plate to the casting material which prevents the casting material from shrinking excessively. They provide a "feed" point where excess casting material is left to feed into the main mold as the curing casting material (fixture) shrinks. Without these feed locations, the curing process may create voids due to the shrinkage.

The invention described herein is applicable to the handling of the circuit card through both process steps: printing and component placement.

The fixture described in this invention utilizes a finished side 1 assembly and a casting process to produce an accurate recessed nest in the casting. The completed support fixture is comprised of the nested casting, a backing plate, and vacuum and/or tooling elements. The process for making the fixture involves unique equipment and a sequence of operations, combined with the finished side 1 assembly.

DESCRIPTION OF THE PREFERRED EMBODIMENT(S)

The invention described herein involves the use of a viscous casting material with a very distinct PC card preparation sequence. The result of this procedure is a highly improved molded support fixture.

Sealing and Locking the PC Card

The support fixture produces planer support even when the sample card has inherent warpage and side 2 bumps. This invention achieves this superior result by drawing the sample PC card down flat into a compliant member lying on a flat plate.

Figure 4A:
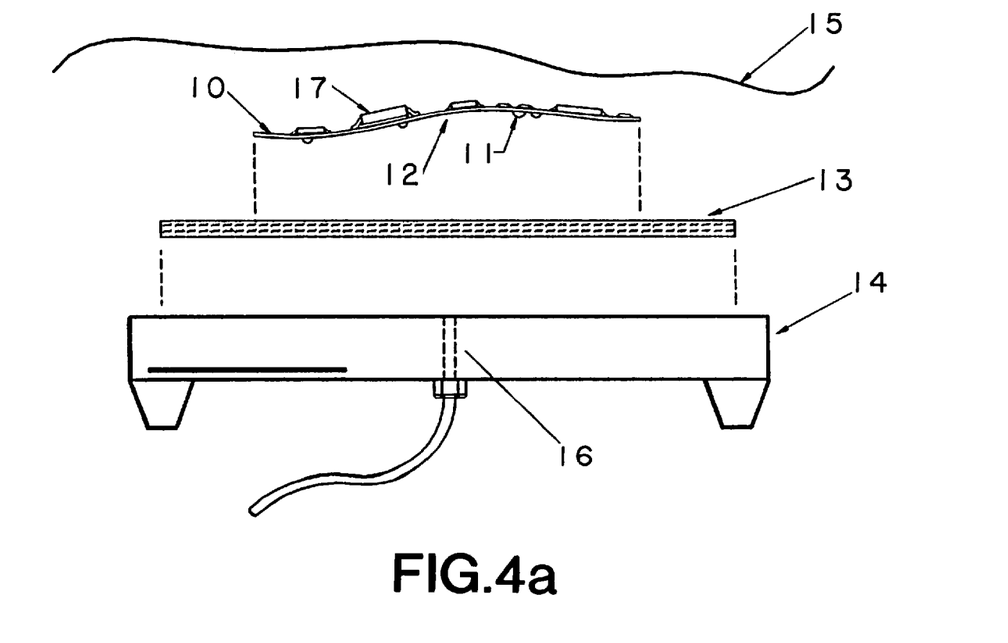
FIG. 4a is an illustration of a vacuum plate with a complaint layer and membrane in a first step of the process of the invention.

Referring to FIG. 4a, a PC card 10 is shown ready to be secured to a support plate 14, specifically a vacuum platen. The platen 14 has a vacuum feed hole 16. A porous compliant member 13 (e.g. felt fabric, low pile, black velvet 30 mils) ensures that the PC card will be flattened in to a true plane during the molding process. This member also serves a second important function of distributing the vacuum of the channel 16 over the full area of the member 13. This "drawing" action is achieved by use of the vacuum and an impermeable, stretchable membrane 15 (e.g. thin guage (10–20 mils) natural latex rubber, −65° to 185° F., tensile strength 4,000 psi Duro. Shore A35–45). The membrane 15 has some inherent 'give' or elasticity or stretch. This allows the membrane to more easily map or contour the topography of the components of side 1.

Figure 4B:
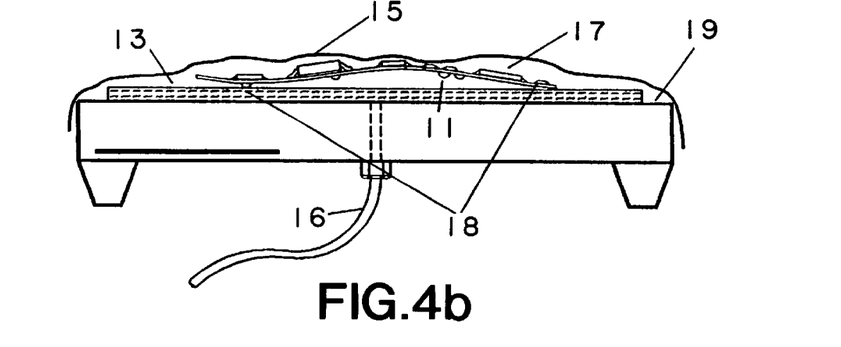
FIG. 4b is an illustration of the components of FIG. 4a being assembled in a second step of the invention.

FIG. 4b shows the membrane 15 beginning to be drawn down. At this point, the PC card is laying in its relaxed state. The PC card 10 is usually warped and will naturally rest on its low points 18. The membrane 15 is beginning to seal to the outer edges 19 of the vacuum platen.

Figure 4C:
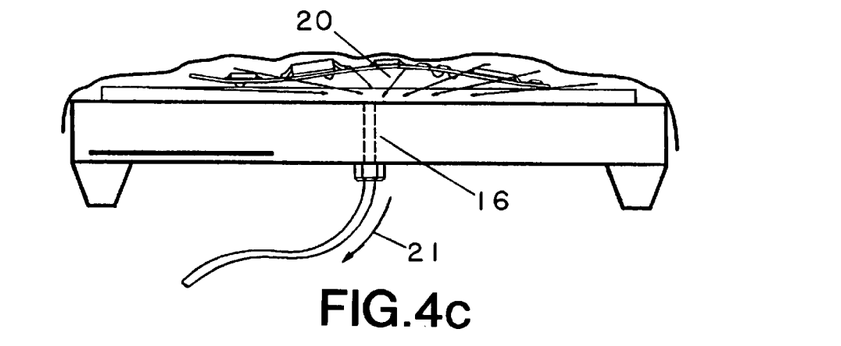
FIG. 4c is an illustration of the air flow from the assembled components of FIG. 4b during membrane evacuation.

FIG. 4c indicates the direction of air flow 20 out of the volume defined between the membrane and the vacuum plate, and through the vacuum port 16.

Figures 4D, 4E:
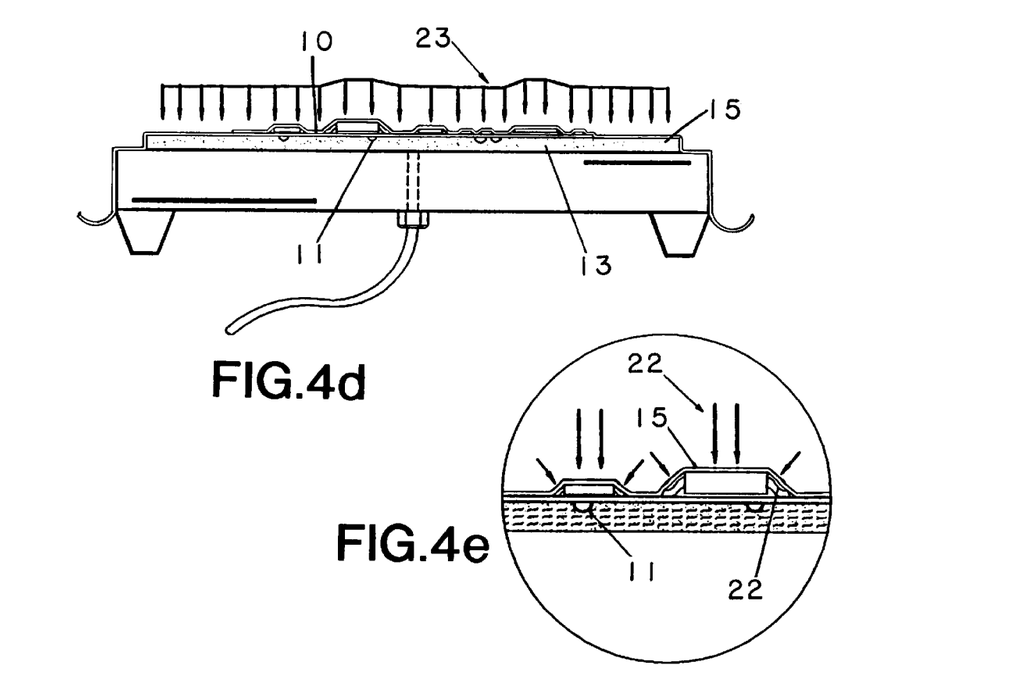
FIG. 4d is the next step in the process after evacuation of the membrane.
FIG. 4e is an illustration illustrating the flatness of the PC board and contouring of the membrane over side 2 of the board.

FIG. 4d shows the membrane 15 drawn fully onto the PC card 10, pulling it flat and defining its position and planarity in preparation for molding. The bumps 11 are depressed into the compliant porous member 13.

FIG. 4e is an enlarged view of the PC card 10 after full evacuation of the membrane. In this view, it is clear that the membrane is being actively utilized as a mechanical locking mechanism and the direction of the forces 22 are homogeneously normal to the surface of the membrane. This force distribution is uniform as shown by the arrows 23 of FIG. 4d. These forces cause the membrane to stretch and pull around all the intricate detail of the PC card. Once a mold is created on top of this stretched membrane, a very accurate three dimensional nest results.

The flexible membrane 15 is used as a vacuum seal to pull the PC card flat and to press it into the thin compliant member 13 in FIG. 4d. The complaint member 13 allows bumps on the non-component side to depress in, leveling the PC card 10 to a true flat plane. It also distributes the vacuum over the full area of the complaint member. If this complaint member were non-porous, the vacuum would not distribute evenly, and the forces holding the card in place would be non-uniform. The compliant member maintains equal, distributed PC card support and pressure by use of a central vacuum and a membrane which sandwiches the PC card and compliant member as shown in FIG. 4d. The bumps on side 2 represent less than 10% of the surface area so this method does not result in a warped set-up.

The process described is insensitive to sample PC card warpage, and side 2 bumps, both of which occur randomly.

Fixture Formation

Figure 5A:
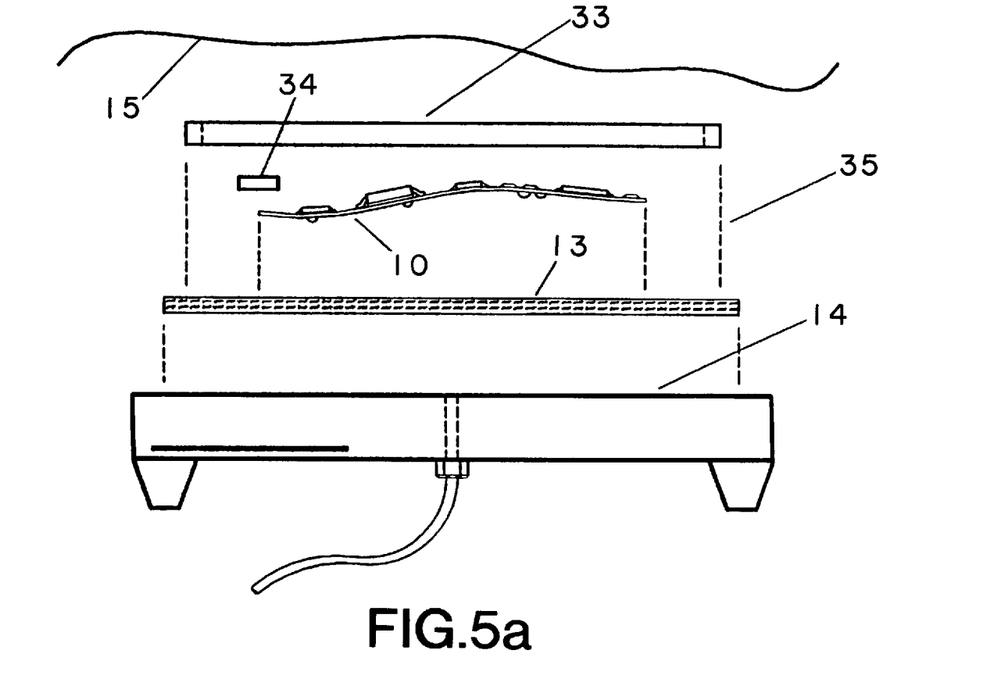
FIG. 5a illustrates the addition of a frame and plug to the formation of the fixture of the invention.

FIG. 5a shows an embodiment of the invention for a case where a "dedicated" work holder is to be created (as opposed to a pallet version, which is described later). The membrane 15, the PC card 10, the compliant-porous member 13, the vacuum platen 14, a rectangular frame 33 and a cylindrical plug 34 are shown. These items are brought on top of one another as indicated by dashed lines. The rectangular frame 33 and the cylindrical plug 34 are placed under the membrane 15. The frame 33 is used to create a mold to pour the casting material into and the cylindrical plug 34 is used to create a recess to allow easy finger access to remove the PC card 10 from the fixture.

Figure 5B:
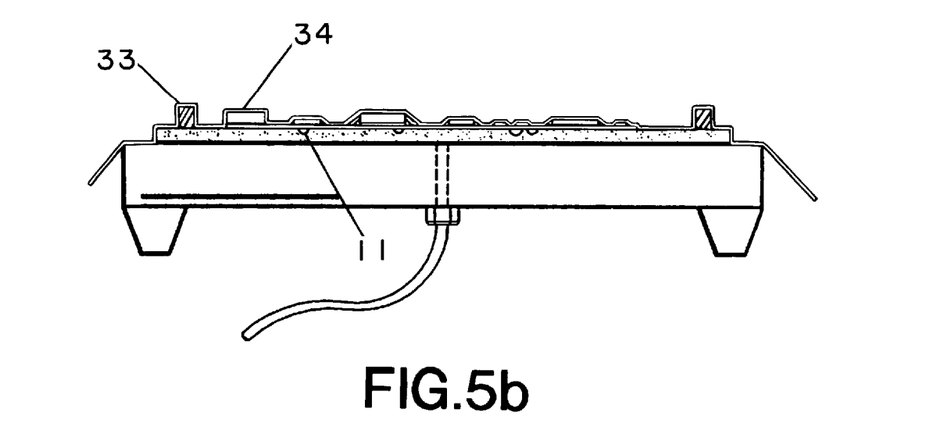
FIG. 5b is an illustration after membrane evacuation.

FIG. 5b shows the invention after the vacuum has evacuated the region under the membrane 15. The frame 33 and the finger plug 34 are now pressed flat and held by the evacuated membrane 15. As described earlier, the bumps 11 and the warped PC card 10 are now pressed against the complaint-porous member 13 to create a truly flat plane. By placing the plug 34 and the frame 33 under the membrane 15, and drawing vacuum, the invention provides a "locking and fixing" capability for any geometric elements that are required in the finished fixture. Alternatively, geometric elements may be anchored into the casting material, for permanent use, or for later removal, to create elements which are not separated from the mold by the membrane (detailed below).

Figure 5C:
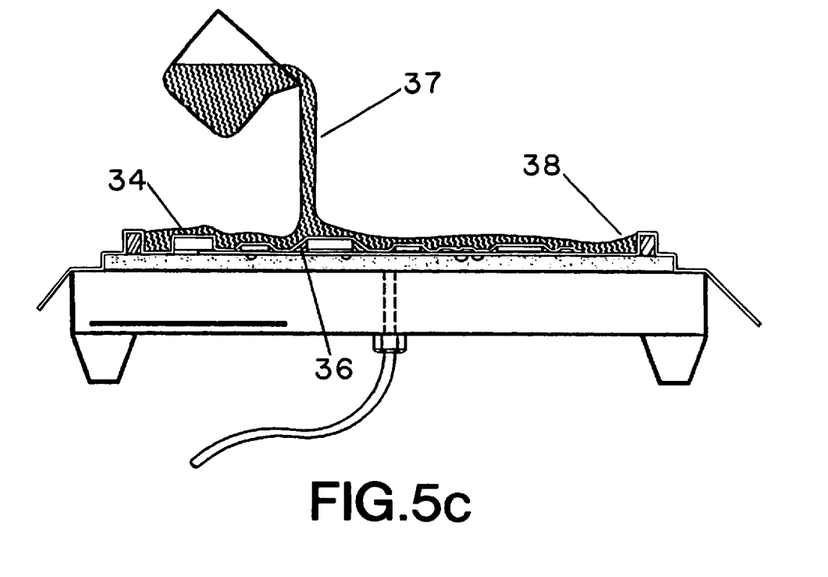
FIG. 5c is an illustration of the addition of a casting material poured onto the membrane and within the frame.

FIG. 5c shows the next step where a casting material 37 (e.g. silicone molding compound RTV 700 and Beta 5 catalyst by General Electric) is poured into the mold defined by the rectangular frame and PC card surface (both of which are covered by the membrane). The membrane 15 serves to hold the elements in place during the casting step and also serves to prevent contamination of the components on the PC board 10. The thickness of the membrane serves to enlarge the recesses in the finished fixture. The thickness is set to a minimum (0.01 inches). This thickness enlarges the recesses, while covering over small delicate areas 36 which, if uncovered, would result in a fixture which may damage delicate areas.

Other elements such as tooling pins or vacuum plugs may be anchored into the casting material directly by positioning them before or after the casting material is poured. These elements may be placed outside the membrane or the membrane may be cut and the elements placed directly in contact with the PC card. A unique aspect of this system is the ability to excise the membrane to anchor elements so they are directly in contact with the PC card. When the membrane is fully evacuated, it may be excised on smooth areas. The excising does not break the vacuum because the open area remains sealed due to the flat contact between the membrane and the surface of the card.

Figure 5D:
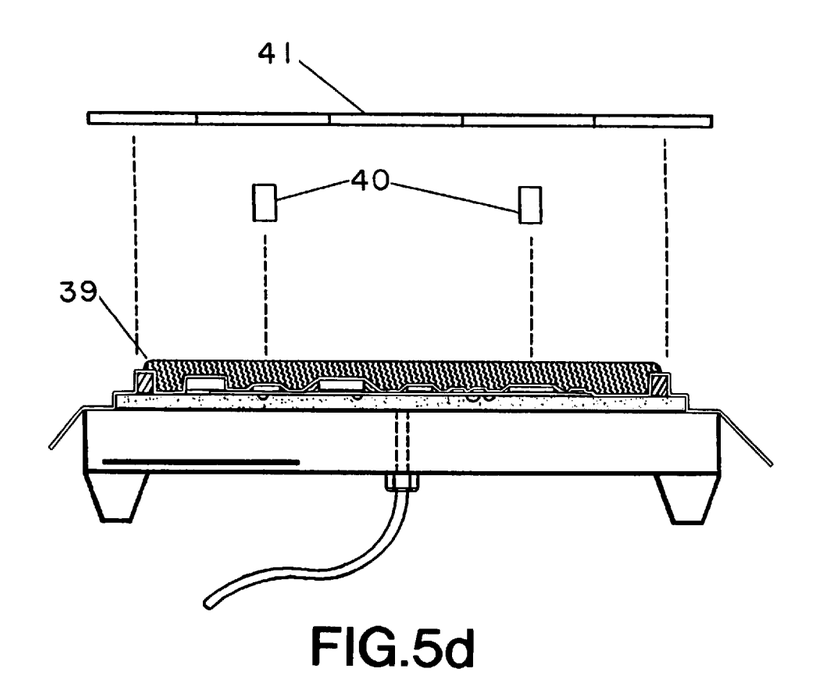
FIG. 5d illustrates the addition of a vacuum plate and plugs to create vacuum holes in the finished fixture.

FIG. 5d shows the fixture after the casting material has been poured and illustrates two vacuum plugs 40 being placed into the casting material. The vacuum plugs are cylindrical pieces which are placed into the casting material and removed after the casting is cured. The recesses created by these plugs will serve to provide for communication of a vacuum from a standard chuck to the component side of the PC card during final use of the fixture. The plugs are seated and pressed into the membrane at sites where vacuum hold down is desired on the finished fixture. The casting material is poured to overfill the mold created by the frame 33. This overfill 39 provides enough excess material to allow for shrinkage which might occur during the mold curing step.

Figure 5E:
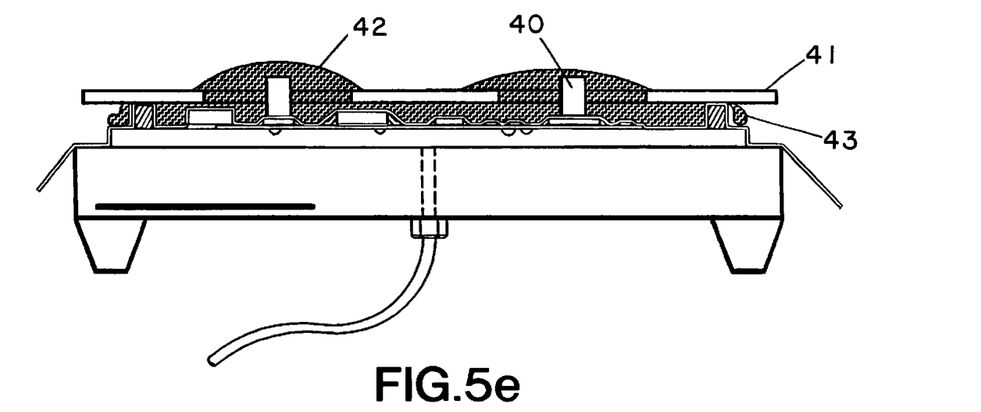
FIG. 5e illustrates the finished casting.

A backing plate 41 is pressed onto the overfilled mold as shown in FIG. 5e. The plate squeezes excess casting material out through large back holes 42 and around the edges of the frame 43.

Figure 5F:
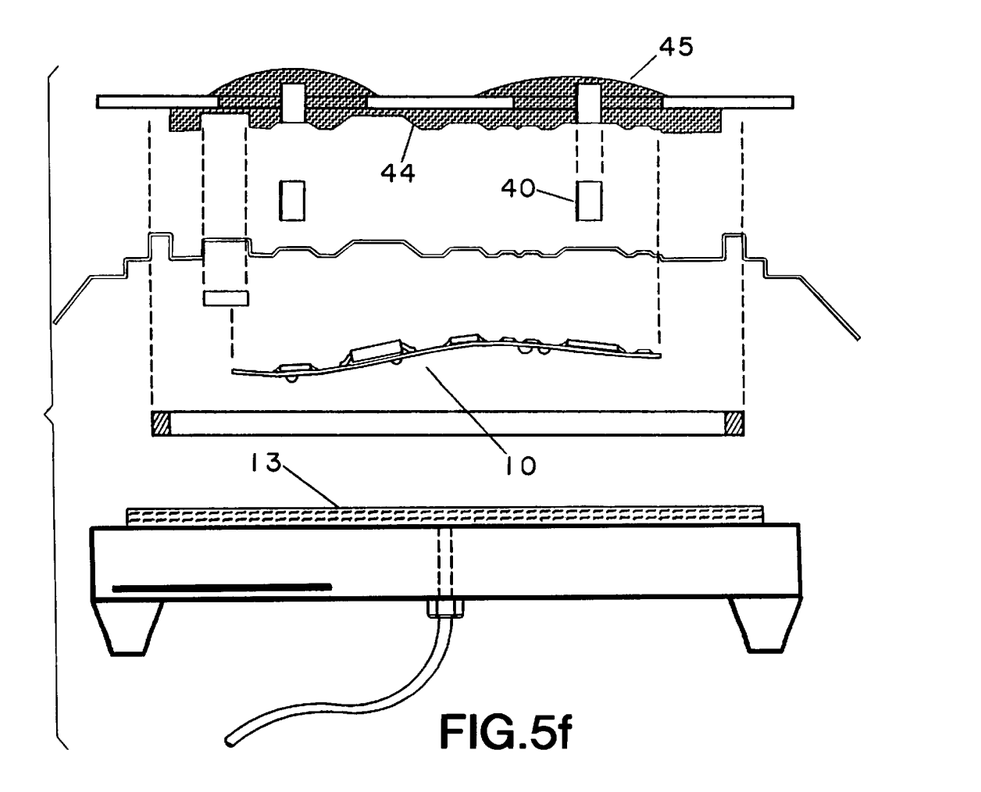
FIG. 5f illustrates separation of the assembled components.

FIG. 5f shows the separation of the various components. The casting material cures and sets and defines a nest with a similar geometry to the outer membrane surface 44. The plugs 40 are removed, and the PC card 10 returns to its relaxed, warped state. The complaint-porous member 13 relaxes to its original state. The excess casting material 45 is now ready to be trimmed away.

Figure 5G:
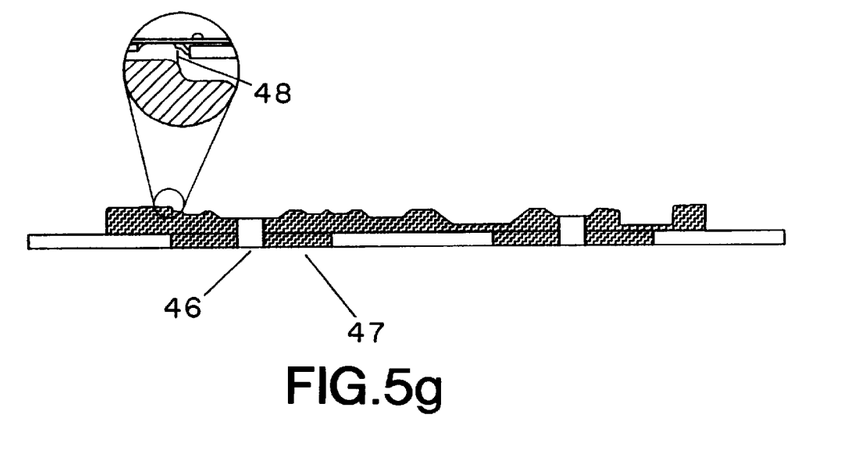
FIG. 5g illustrates the finished nested fixture with excess mold material trimmed.

FIG. 5g shows the finished fixture with vacuum feed through holes 46 and casting material which is recessed into the back plate at locations 47. An enlarged view is also shown in FIG. 5g at 48. This enlarged view shows a natural radius created by this invention which helps to facilitate engagement between the PC card and the fixture when there is a slight misalignment.

Figure 6:
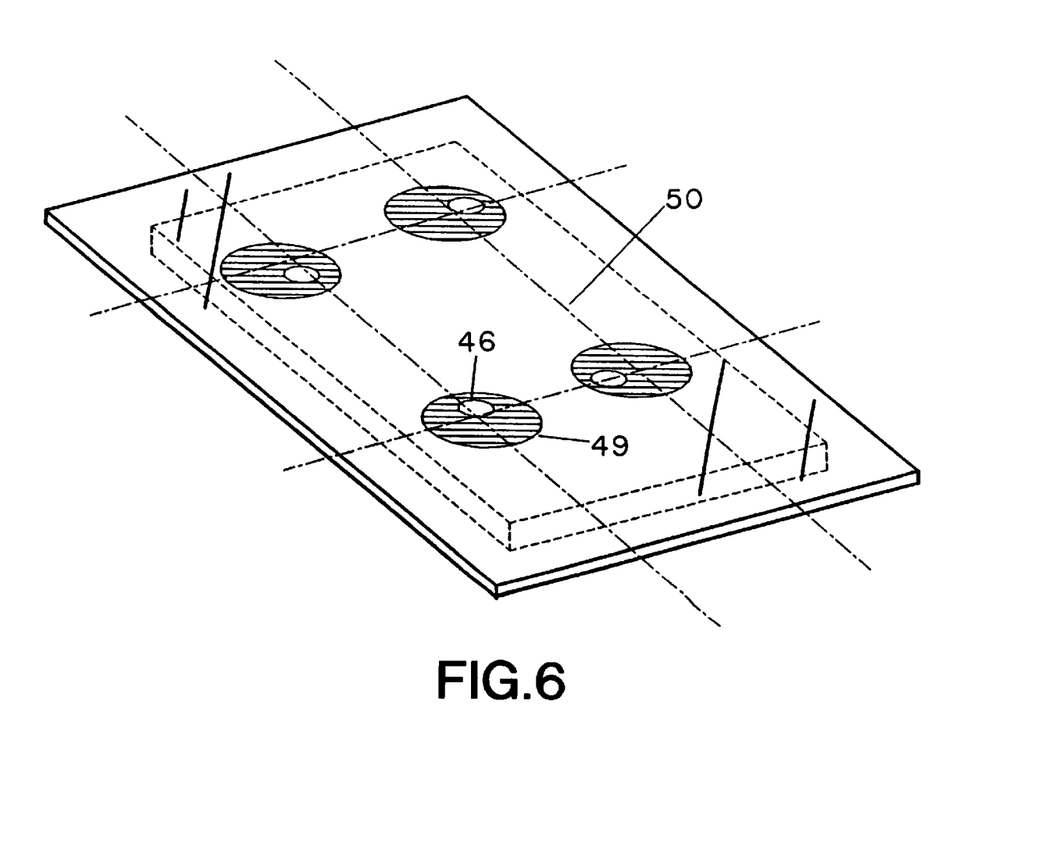
FIG. 6 is a perspective view of the bottom side of a batch version of a fixture illustrating circular cutouts and vacuum holes.
Figure 7:
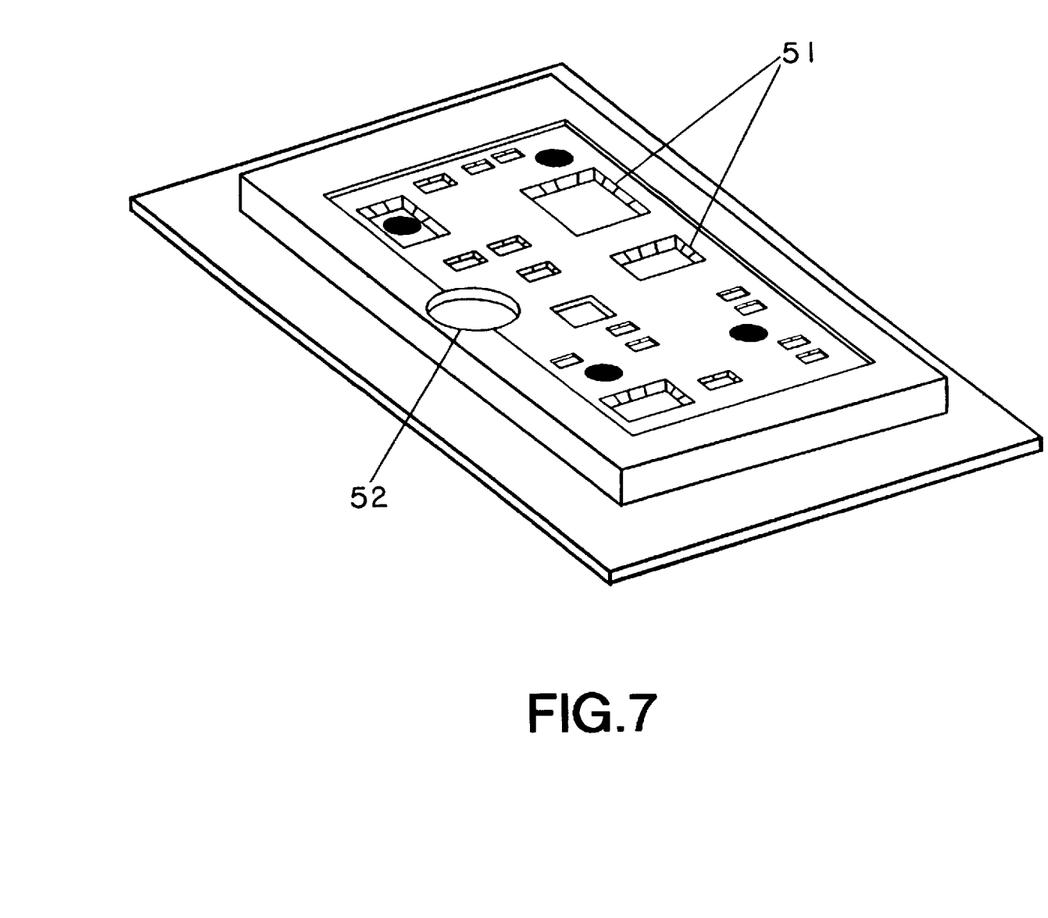
FIG. 7 is a top perspective view of a finished batch version of the fixture showing finger recesses and clean, accurate recesses.

FIGS. 6 and 7 show the bottom and top of the finished fixture respectively. In FIG. 6 the manifold regions 49 are indicated, and the feed through vacuum holes 46 are shown. With this arrangement of larger and smaller holes, a manifold may be created which acts as a "standard" manifold. Many different custom fixture scan be used with the standard manifold, as long as the large hold pattern 50 is maintained. This saves time and money by eliminating the need for a custom manifold on each and every fixture.

FIG. 7 shows the high detail that results from a fixture produced with the invention of this disclosure. This unique process produces a fixture with all the necessary recessed locations 51, while maintaining a very high flatness and parallelism, within 0.01" flatness over a 8" length. The finger plug recess 52 allows ergonomic access to the edge of the PC card for loading and unloading.

Pallet Type Fixtures

Figure 8A:
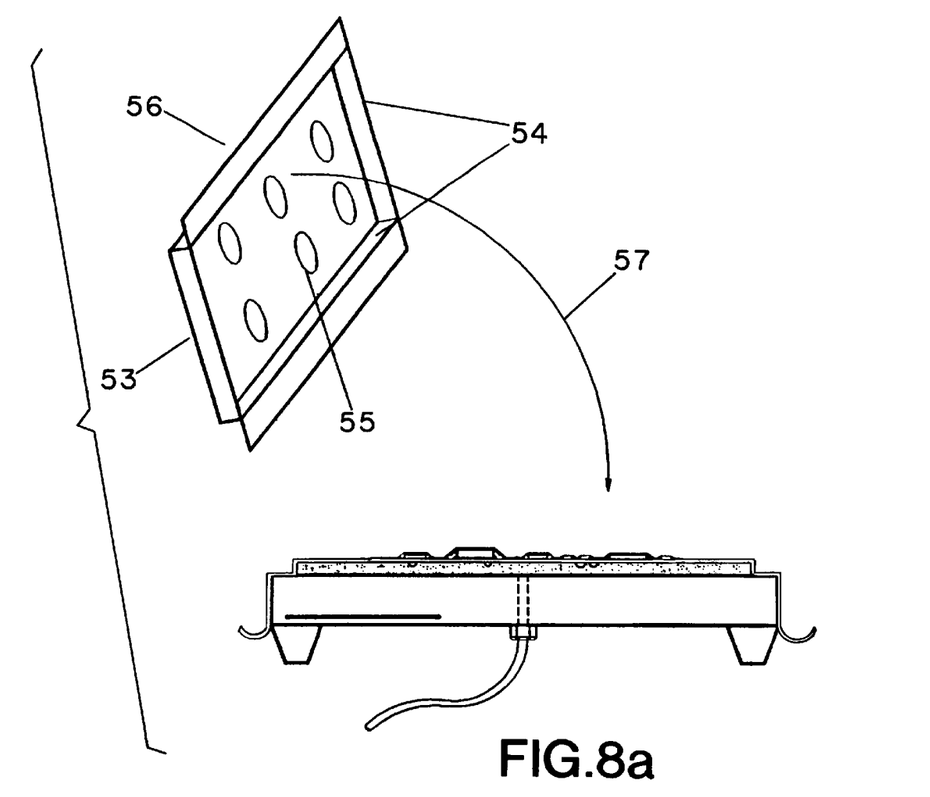
FIG. 8a is an illustration and an exploded perspective view of a pallet frame placement on an evacuated membrane PC board and compliant material.
Figure 8B:
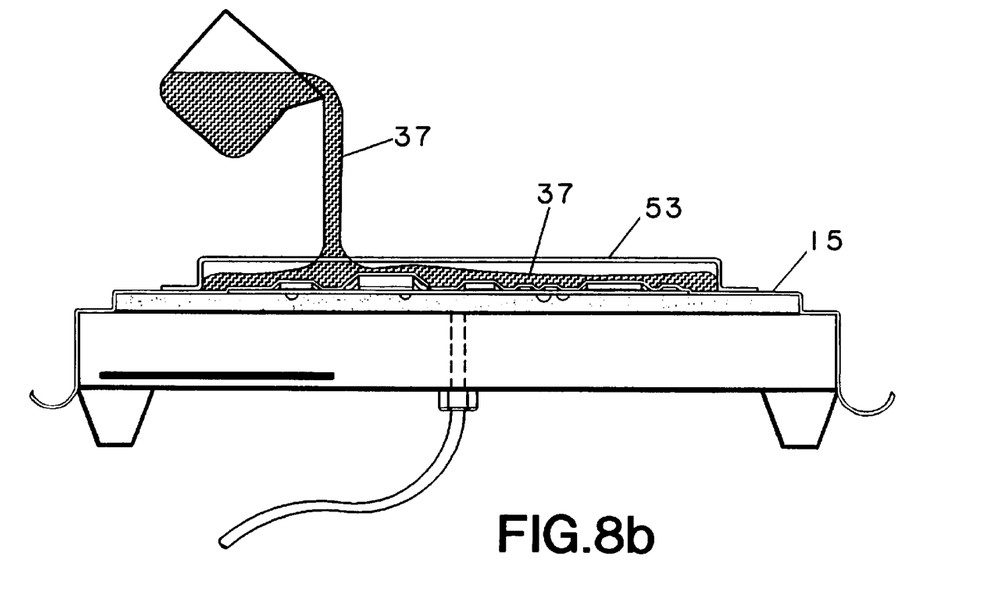
FIG. 8b is an illustration of pouring a casting material into a pallet frame.
Figure 8C:
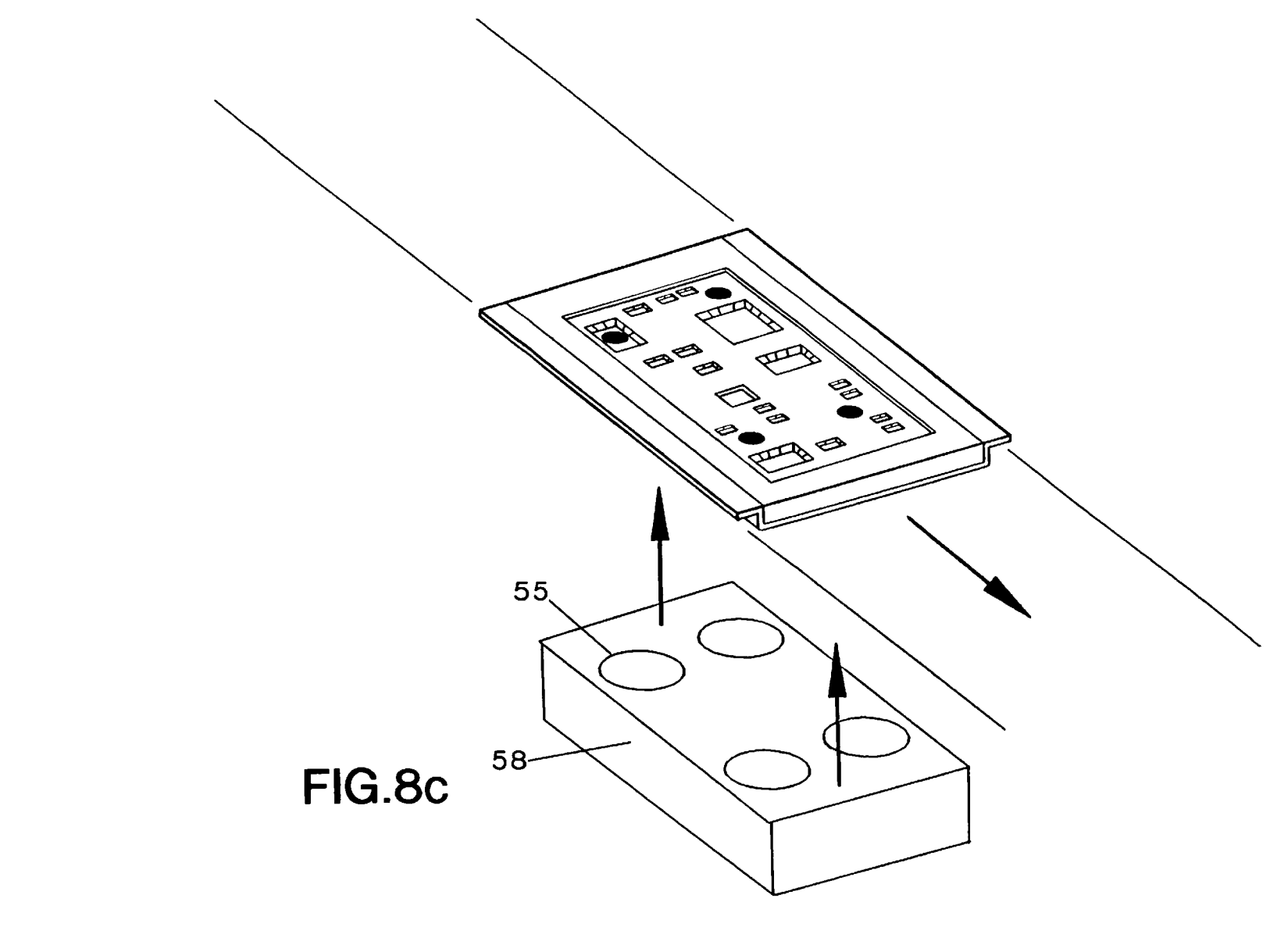
FIG. 8c is an exploded perspective view of a pallet board lock fixture and mating vacuum tool.

FIGS. 8a–c show the invention embodied in pallet-type fixtures which may be fed through the entire SMT line. The frame is replaced by a box-like enclosure 53 made of 1/16" thick aluminum, with sides 54 in FIG. 8a, back holes 55 and flanges 56. The pallet frame is placed on to the. PC card after it has been mechanically prepared by the vacuum plate invention as shown by direction line 57 in FIG. 8a. The casting material 37 is poured as shown in FIG. 8*b* through the back holes. Then vacuum plugs are placed and a finished pallet is created as shown in FIG. 8*c*. A vacuum chuck 58 is shown in FIG. 8*c* has the standardized hole locations allowing use with different pallets. Any air bubbles which are entrapped in the pouring material will float up to the backing plate thereby eliminating any non-support areas created by these voids.

The invention described herein is applicable to the handling of the circuit card through both process steps: printing and component placement.

One unique benefit to this fixture forming process is the ability to create a nest which is a geometric scale larger than the original circuit card pattern. The membrane separates all geometries of the circuit card side 1, from the fixture, by an amount equal to the thickness of the membrane. When the fixture is used in production, is will serve as a nest for many similar side 1 assemblies. However, there will be some component positional variation from card to card. If the molded fixture has an exact 1:1 size relationship with a master circuit card, then some of the cards would not set into the fixture properly.

Casting involves making exact replicas of models. Often the models are oversized to allow the shrinkage to produce the desired size. The invention prevents shrinkage (using the backing plate), and actually produces an enlarged representation of the original side 1 assembly, by utilizing a stretched membrane with a given thickness.

Modern molding processes employ mold release agents, so the finished part will remove from the mold easily. The concept of a vacuum stretched membrane achieves this purpose and is not obvious from existing mold processes. In fact, this invention demonstrates an unobviouse inversion of molding processes. Where a mold produces a finished positive, this technique achieves a finished negative.

The foregoing description has been limited to a specific embodiment of the invention. It will be apparent, however, that variations and modifications can be made to the invention, with the attainment of some or all of the advantages of the invention. Therefore, it is the object of the appended claims to cover all such variations and modifications as come within the true spirit and scope of the invention.

Having described my invention, what I now claim is:

1. A molding assembly kit for forming a fixture wherein the kit comprises a platen having vacuum holes formed therein, a porous member supported by the vacuum platen and communicating with the vacuum holes, a peripheral mold placed on the porous member to define a mold cavity, a membrane placed to sealingly cover the mold and the porous member and a casting material whereby when a first side of a card is placed over the porous member and under the membrane, and vacuum is drawn via the vacuum holes, the membrane first conforms to a surface of a second side of the card opposing to the first side; and whereby a moldable material is poured over the membrane into the mold cavity to form the casting material having a nest which is a substantially mirror image of the second side of the card.

* * * * *